United States Patent [19]

Peerenboom et al.

[11] Patent Number: 4,490,614

[45] Date of Patent: Dec. 25, 1984

[54] HOUSING FOR AN IONIZATION DETECTOR ARRAY IN A TOMOGRAPHIC SCANNER

[75] Inventors: B. David Peerenboom, Kildeer; Kenneth L. Sypal, Glen Ellyn, both of Ill.

[73] Assignee: Interad Systems, Inc., Schaumburg, Ill.

[21] Appl. No.: 373,431

[22] Filed: Apr. 30, 1982

[51] Int. Cl.³ .......................... G01T 1/18; H02G 13/08
[52] U.S. Cl. ..................................... 250/385; 174/52 S
[58] Field of Search .............................. 250/374, 385; 174/17 CT, 52 S, 35 GC

[56] References Cited

U.S. PATENT DOCUMENTS 4,161,655  7/1979  Cotic et al. .................. 250/374

Primary Examiner—Janice A. Howell
Attorney, Agent, or Firm—Dennis O. Kraft

[57] ABSTRACT

An improved housing construction for electrical apparatus is disclosed, the housing having particular utility as a housing suitable for an ionization detector array of a tomographic X-ray scanner. The housing comprises at least two mating sections which, upon assembly and juxtaposition one to another, form a closed interior chamber adapted to receive the detector array, or other electrical apparatus. A gasket means preferably comprising a so called "flexible" printed circuit constructed of a suitable polymer plastic is provided between the assembled mating sections of the housing to effect a sealing of the interior chamber. Electrical conductors, such as a metallic printed circuit foil, are disposed within the polymer material and extend between the interior chamber and the exterior of the housing. The conductors define means by which electrical connections can be made to electrical apparatus within the chamber, such as the detector array, and external circuitry. This construction eliminates the necessity of providing separate conductor feedthroughs in the housing. Further, the sealing of the chamber is enhanced through the provision of O-ring seals disposed in the mating surface of each of the two mating sections of the housing, the sealing rings being laterally offset one from the other such that when the mating sections are assembled and juxtaposed with the gasket means therebetween, the O-shaped sealing rings are staggered.

4 Claims, 3 Drawing Figures

HOUSING FOR AN IONIZATION DETECTOR ARRAY IN A TOMOGRAPHIC SCANNER

BACKGROUND OF THE INVENTION

This invention generally relates to housings for electrical apparatus and has particular utility as an improved housing for an ionization detector array of a tomographic X-ray scanner.

By way of background, tomographic X-ray scanners enable a medical practitioner to non-invasively obtain detailed information relative to the location and condition of organs and other tissues within a patient's body, such information taking the form of a radiographic image of a thin cross-section or "slice" of the area of the body under consideration.

In the computer-assisted tomographic process, a narrow X-ray or gamma ray beam is transmitted transversely through a section of the patient anatomy and the emerging beam is detected by high-efficiency radiation detectors. A series of individual measurements of the transmitted radiation is made about the subject so as to obtain multiple views of the "slice" in question. By virtue of these views, large amounts of information and data are acquired as to the differences in radiological contrast of the cross-section in question. This data, constituting individual measurements at many angles about the subject, then provides the input from which X-ray or gamma ray attenuation coefficients can be calculated in a computer and the image of the cross-section of the patient anatomy actually reconstructed. Thus, a computer-assisted tomographic scanner obtains, by mathematical reconstruction, a transverse sectional image from transmitted radiation projection data, all as is well known.

A typical apparatus utilized in the tomographic process as above described can be seen by initial reference to FIG. 1 of the appended drawings. A closely collimated X-ray source 10 is designed to ideally deliver a very narrow beam or beams of photons 12 through a "slice" 14 in an object 16 which typically is the torso or head of the patient. A multi-channel radiation detector 18 is disposed opposite the collimated X-ray source so as to receive the beam or beams of photon 12 passing through the slice 14 of interest, all while the collimated X-ray source 10, and the detector 18 in this example, undergo relative motion with respect to the patient, i.e. rotational motion in this example.

During the rotation of the source and detector, each detector element which constitutes adjacent pairs of the electrode plates 20, forms a data channel and responds to the beam from the collimated X-ray source. Considering the rotational movement, however, each detector element obtains a different and discrete data set relative to the amount of attenuation of the X-ray beam passing edgewise through the plane of interest 14. This information then is fed to a conventional non-illustrated external signal processing circuit including a computer whereat, through well-known mathematical algorithms, the image through the plane of interest or cross-sectional slice 14 of the patient is reconstructed.

The multi-channel radiation detector 18 typically comprises a plurality of stacked or spaced-apart electrode plates 20 which are disposed as shown in an elongated chamber 22 which is filled with a pressurized ionizable gas. It is necessary, of course, to extract signals generated by each of the electrode plates 20 to the exterior of the elongated housing 22 for connection to the signal processing circuits as described. In this respect difficulties have been encountered in the prior art in effecting the so-called "feedthrough" of the electrical connections from the interior of the elongated detector chamber to the exterior thereof.

For example, radiation detectors in this environment typically have hundreds of closely-spaced electrode plate pairs, with each electrode plate requiring an electrical connection thereto. Very finely machined "feedthroughs" such as schematically indicated at reference numeral 24 typically are provided. The precision machining necessary to generate so many closely spaced feedthroughs markedly raises the cost of the resulting detector structure. Considering that the detector array is disposed in a pressurized ionizable gas, the possibility of gas leakage due to the provision of so many connector feedthroughs is increased. Further, and recognizing the inherent sensitivity of the low-magnitude signal extraction from the electrode plates, the many individual connectors needed to effect the electrical coupling, the varying distances between the individual connector wires, and the resulting changes in inter-connector capacitance, oftentimes combined to create signal perturbations which resulted in measurement errors.

Notwithstanding such problems as are associated with the feedthrough of the electrical conductors to the detector array disposed within the sealed chamber, no other means of effecting the necessary connections were recognized to exist.

SUMMARY OF THE INVENTION

It is thus apparent that a need exists in this art for an improved housing design in which the feedthrough of electrical leads or connectors is greatly facilitated. It is the primary object of the instant invention to provide such an improved housing, and particularly an improved housing that obviates the known difficulties associated with the feedthrough of conductor leads to multi-channel detectors in tomographic apparatus.

A further objective of the instant invention is the provision of an improved housing which is capable of effectively sealing an electrical apparatus therein in an interior chamber thereof, yet still enabling feedthrough of electrical connections thereto.

Another objective of the instant invention to provide an improved housing for electrical apparatus which enables a plurality of closedly spaced connections to be made economically to an apparatus disposed in the interior of such housing.

These and other objectives of the instant invention which will become apparent as the description proceeds are implemented by the provision of an improved housing which comprises at least two mating sections.

These sections, upon assembly and juxtaposition one to another, form a closed interior chamber adapted to receive electrical apparatus, such as a plurality of electrode plates of a multi-channel tomographic detector array. A gasket means is disposed between the assembled mating sections of the housing to effect a sealing of the interior chamber. In the preferred inventive embodiment, the gasket means comprises a flexible layer of electrically insulating material, such as a polymer plastic, in which a plurality of electrically conductive strips are contained so as to form a composite. The electrically conductive strips extend between the interior chamber and the exterior of the housing in the gasket means and serve to define means for making external connections to the electrical apparatus within the chamber.

With this novel construction, the necessity of providing closely-machined mechanical feedthroughs for the electrical connectors is eliminated, and the problems associated with such feedthroughs are thereby obviated. Further, the interconnector spacing is fixed with the technique of the instant invention in that the connectors are imbedded or otherwise permanently contained in a fixed relative position within the flexible polymer plastic. Thus, in low signal strength environments such as exist in a multi-channel ionization detector array, the "noise" level of the signal is reduced as is the probability of errors in the detector count. Obviously, the elimination of the necessity of machining a plurality of feedthroughs and the substitution instead of a simple flexible composite functioning both as a sealing means and as an electrical connector markedly decreases the cost of the housing, this being a major advantage.

Lastly, and so as to enhance the sealing of the interior chamber, an o-shaped sealing ring is preferably disposed in the mating surface of each of the two main or mating sections of the housing, the o-shaped sealing rings of the mating sections being laterally offset one from the other such that when the mating sections are assembled and juxtaposed, the o-shaped sealing rings are staggered. If the interior chamber contains a pressurized gas, again such as would be the case with a multi-channel ionization detector, the possibility of leakage is further reduced by this staggered o-ring construction. Specifically, each o-ring serves to press against the flexible composite gasket means, and then against the mating surface of the opposing mating section of the housing. The housing itself can be constructed of any suitable material, such as aluminum.

BRIEF DESCRIPTION OF THE DRAWINGS

The invention itself will be better understood from the following detailed description of the preferred embodiment thereof, which description makes reference to the appended sheets of drawings wherein.

DETAILED DESCRIPTION OF A PREFERRED EMBODIMENT

Figure 1:
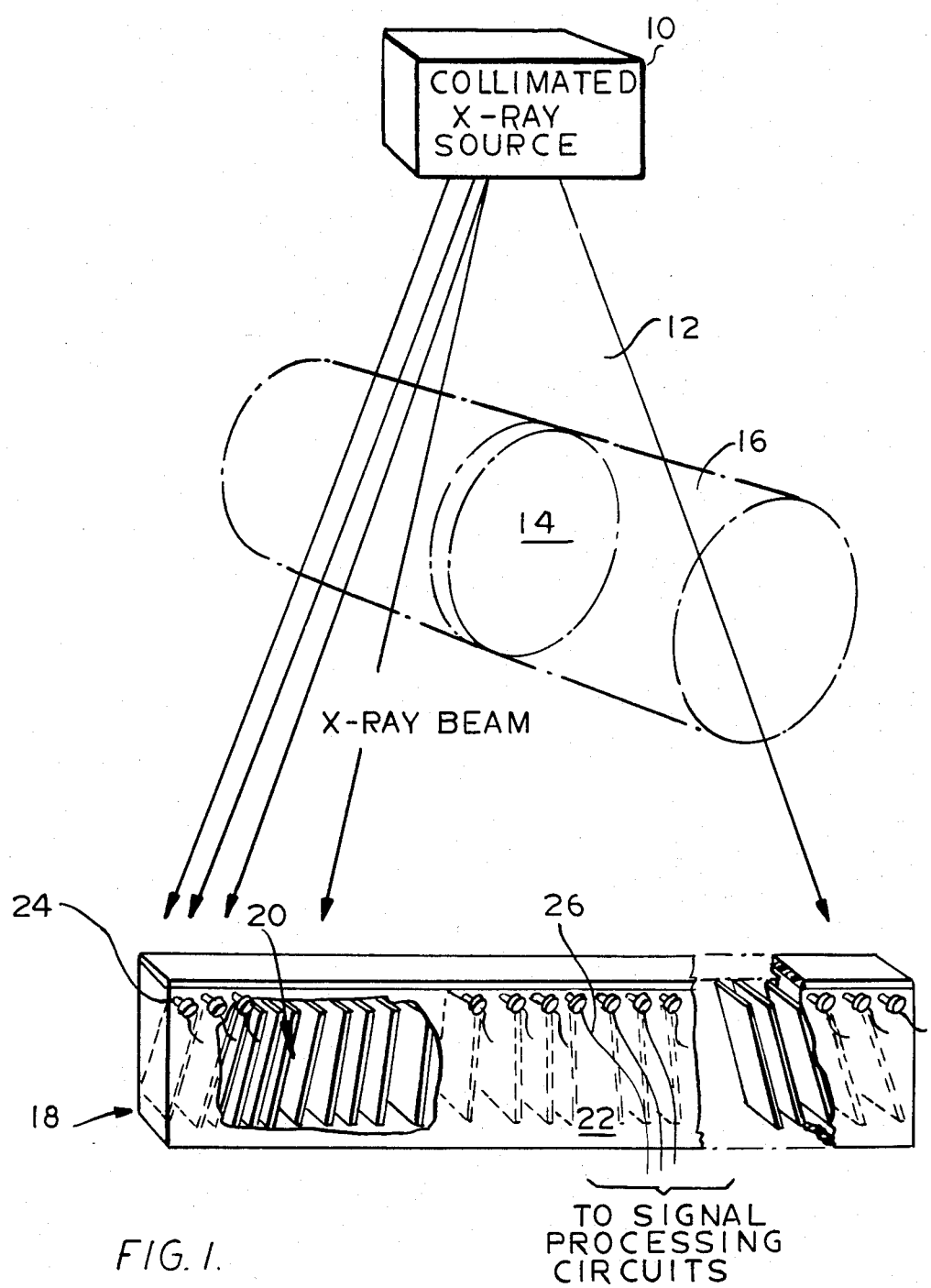
FIG. 1 is a perspective illustration of a typical prior art tomographic X-ray scanner imaging system, which Figure has already been briefly discussed above.

With reference again to FIG. 1 of the appended drawings, the detector 18 as depicted therein includes, as is typical, a plurality of stacked electrode plates 20 arranged in side-by-side fashion with each electrode plate pair forming therebetween an ionization compartment or chamber. As ionizing radiation impinges between the plates of an electrode plate pair, a current flow of very small magnitude is induced therebetween, it being understood that the plates are biased through the application thereto of a voltage potential through an external source not illustrated. The current signal thereby obtained from each electrode plate pair is indicative of the magnitude or level of radiation impinging thereon, and this signal is itself sensed and transmitted to an external processing circuit.

The multiplicity of electrode plates 20 are, of course, closely packed within the chamber or housing 22, which housing is filled with an ionizable gas such as xenon, to a pressure of 8–12 atmospheres.

So as to apply the necessary electrical potential to the electrode plates 20 and so as to carry from such electrodes the induced signal obtained by the impingement of ionizing radiation in the space between the electrode pair, it is of course essential that electrical connection be made between the exterior of the detector housing 22, and each of the electrode plates 20 in the sealed interior thereof. To this end, and as is typical in the prior art, machined "feedthroughs" such as indicated at 24 are shown as being provided in the side walls of the detector housing 22, each feedthrough constituting a threaded bolt-like apparatus containing an electrical conductor such as indicated at reference number 26 disposed between a signal processing circuit external of the housing, and a particular electrode plate 20, for example. Given the large number of closely spaced electrode plates in a typical detector, one can readily appreciate the difficulties that result in the fabrication of a plurality of closely spaced mechanical feedthroughs of the conventional construction indicated at 24. The tolerances are, of course, very close for the many machining operations that are needed and this substantially raises the ultimate cost of the product.

Further, the wires passing through each "feedthrough" 24 such as indicated at 26, are not fixed relative to one another and with respect to the spacing between such wire leads. As such, undesirable "noise" may be picked up by the circuitry, and an unreliable datum generated. Additionally, the large number of feedthroughs 24 required create a high probability of leakage of the pressurized gas within the interior chamber.

The instant invention obviates these problems by providing an improved housing which enables electrical connection to be made between the interior chamber and the exterior thereof in a simple manner, eliminating the necessity of conventional "feedthroughs". Specifically, attention should now be directed to FIG. 2 of the appended drawings wherein an exploded view of a housing constructed in accordance with the teachings of the instant invention is shown.

The housing will be seen to include at least two mating sections, such as the elongated lower section 28, and the upper lid or section 30, these two mating sections, upon assembly and juxtaposition one to another, serving to form a closed interior chamber adapted to receive virtually any electrical apparatus. For purposes of explanation, a plurality of electrodes 20 constituting a multi-channel ionization detector array is shown as constituting the electrical apparatus. The housing, including both the lower and upper sections 28 and 30 thereof, can be constructed of virtually any suitable material, such as aluminum.

Figure 2:
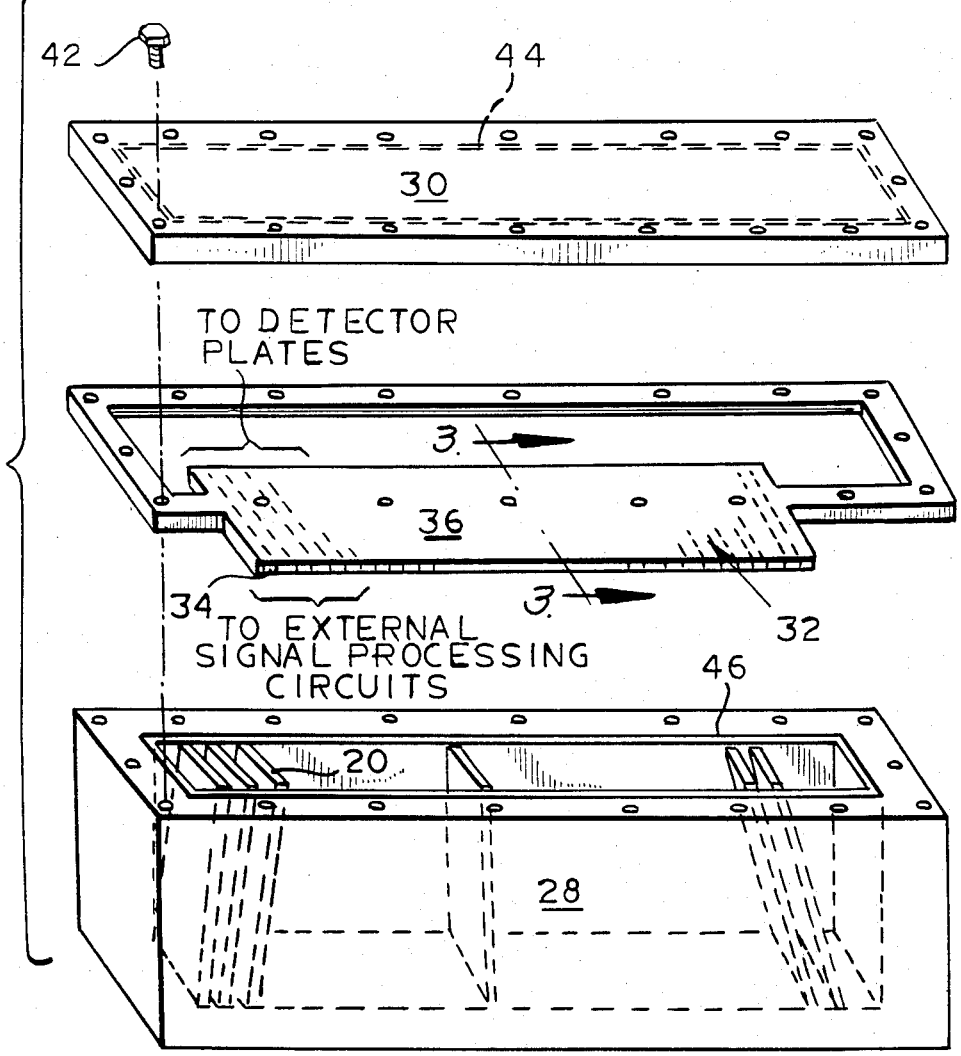
FIG. 2 is a perspective exploded illustration of a housing for an electrical apparatus, such as a multi-channel ionization detector, constructed in accordance with the teachings of the instant invention.

Since the housing when assembled forms a closed interior chamber which is adapted to contain a pressurized atmosphere (or, alternatively, an evacuated atmosphere), a gasket means necessarily be disposed between the assembled mating sections 28 and 30 of the housing to effect a sealing of the interior chamber. In this respect, suitable gasket means indicated by reference numeral 32 are provided and comprise a flexible layer of an electrically insulating material, such as polyimide or some other suitable polymer, in which a plurality of electrically conductive strips are contained. Such strips, in FIG. 2, are indicated by reference number 34, and are depicted as being imbedded within a somewhat expanded or enlarged tab-like area 36 of a polymer substrate 32.

Figure 3:
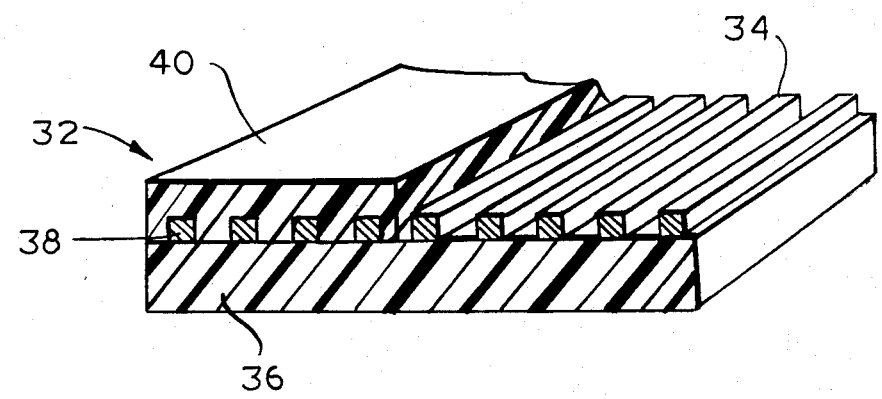
FIG. 3 is an elevational view, partially broken away and in section along the lines 3—3 of FIG. 2, illustrating the construction of the gasket material or sealing means for the housing of the instant invention and through which electrical connection is made from the interior chamber of the housing to the exterior thereof.

In the preferred inventive embodiment, and as indicated in FIG. 3, the gasket means 32 will comprise a lower substrate 36 of a flexible polymer such as Kapton (a registered trademark of E. I. DuPont de Nemours and Company, Inc.) to a thickness of 0.003 inches, having a 0.0014 inch copper printed circuit foil 38 clad thereto by an adhesive bond so as to form a flexible composite. The clad laminate can then be etched or otherwise worked to form a printed circuit represented by the plurality of conductive strips 34 indicated both in FIGS. 2 and 3. Finally, a polyimide oversheet 40 would be adhesively bonded on the substrate to complete the assembly.

The flexible polymer serves to effect a seal between the two mating sections 28 and 30 of the housing with the electrical conductors 34 through such seal allowing easy connection from the exterior of the housing to any electrical apparatus therein. As is indicated, the top and bottom sections 30 and 28 of the housing are contemplated to be bolted or otherwise fastened together such as by utilizing any suitable fastening means 42 as representively illustrated.

Since a flexible printed circuit sheet or layer is in fact utilized for both the sealing and electrical connection functions, technology associated with the fabrication of such printed circuit boards, including photographic etching techniques, can be utilized to create virtually any pattern of conductors or connectors within the polymer substrate. Thus, it is a relatively simple matter to provide connection to many hundreds of different internal electrical devices, such as each plate 20 of a detector array, for example, and such multiple connections have no adverse impact on the effectiveness of the gasket means 32 to create a suitable seal, given the flexibility of the polymer substrate. Further, and even in a high radiation environment such as exists in a multichannel detector array, no substantial deterioration of the polymer substrate material has been noted during operation thereof.

So as to enhance the sealing function performed by the gasket means 32, an o-shaped sealing ring is disposed in the mating surface of each of the two mating sections 28 and 30 of the housing. The sealing ring in the top or upper lid 30 is indicated by reference numeral 44, and is disposed on the underside of the surface as viewed in FIG. 2. The sealing ring 46 is disposed in the mating surface of the lower elongated housing section 28 as is indicated. The o-shaped sealing rings 44 and 46 in the respective mating surfaces of the mating sections 30 and 28 are laterally offset one from the other, with both sealing rings being disposed towards the inside of the bolt-holes. When the mating sections 28 and 30 are assembled and juxtaposed, the o-shaped sealing rings are therefore staggered. This staggering has been found to greatly enhance the sealing properties of the gasket means 32 in that each sealing ring presses against a solid surface of the opposed mating section through the flexible gasket material.

It should be appreciated that the scope and concepts of the instant invention has applicability to virtually any sealed housing wherein electrical connection must be made from the exterior thereof to the electrical apparatus disposed therein. Further, and while specific polymers have been described as being useful for fabrication of gasket means, functionally equivalent materials may be utilized. Such materials must exhibit the properties of a smooth, nonporous exterior surface, and also have suitable flexibility so as to perform as well as a gasket while still allowing electrically conductive strips to be imbedded or otherwise contained therein.

It should be apparent that the objectives set forth at the outset of this specification have now been successfully achieved.

What is claimed is:

1. A sealed housing for electrical apparatus, said housing comprising at least two mating sections which, upon assembly and juxtaposition one to another, form a closed interior chamber; a gasket comprising a flexible layer of electrically insulating material disposed between the mating sections of said housing, a plurality of electrically conductive strips being imbedded within said gasket and extending between the interior chamber and the exterior of the housing to define an electrical feedthrough; and an "O"-shaped sealing ring disposed in the mating surface of each of said two mating sections of the housing, said sealing rings being laterally offset one from the other and positioned such that when said mating sections are assembled and juxtaposed, each sealing ring presses against said flexible gasket and then against the mating surface of the opposing mating section of the housing.

2. A housing as defined in claim 1, wherein said electrically insulating material of said gasket is a polymer plastic.

3. A housing as defined in claim 1, wherein said gasket comprises a flexible composite of a polymer substrate clad with an electrically conductive layer forming individual conductive strips, a coverlay of a further polymer film being adhesively bonded thereto.

4. A housing as defined in claim 3, wherein said electrically conductive layer comprises a printed circuit.

* * * * *